US012812890B2

(12) United States Patent
Chen

(10) Patent No.: US 12,812,890 B2
(45) Date of Patent: Nov. 24, 2026

(54) STRUCTURE AND FORMATION METHOD OF SEMICONDUCTOR DEVICE WITH SEMICONDUCTOR NANOSTRUCTURES

(71) Applicant: Taiwan Semiconductor Manufacturing Company, Ltd., Hsinchu (TW)

(72) Inventor: Chih-Yang Chen, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 636 days.

(21) Appl. No.: 18/317,351

(22) Filed: May 15, 2023

(65) Prior Publication Data

US 2024/0387716 A1 Nov. 21, 2024

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 64/23*** | (2025.01) |
| ***H10P 50/28*** | (2026.01) |

(52) U.S. Cl.

CPC ......... *H10D 30/43* (2025.01); *H10D 30/6735* (2025.01); *H10D 62/121* (2025.01); *H10D 64/017* (2025.01); *H10D 64/258* (2025.01); *H10P 50/282* (2026.01)

(58) Field of Classification Search

CPC .. H10D 30/43; H10D 30/6735; H10D 62/121; H10D 64/017; H10D 64/258; H10D 30/014; H10D 30/6757; H10D 62/151; H10P 50/282

See application file for complete search history.

(56) References Cited

U.S. PATENT DOCUMENTS

| | | | | |
|---|---|---|---|---|
| 9,209,247 | B2 | 12/2015 | Colinge et al. | |
| 9,236,267 | B2 | 1/2016 | De et al. | |
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2021/0233997 | A1 * | 7/2021 | Chen | H10D 62/121 |
| 2023/0093343 | A1 * | 3/2023 | Gaul | H10D 48/362 257/29 |

* cited by examiner

*Primary Examiner* — Jonathan Han

(74) *Attorney, Agent, or Firm* — Birch, Stewart, Kolasch & Birch, LLP

(57) ABSTRACT

A semiconductor device structure and a formation method are provided. The method includes forming a fin structure over a substrate and forming a nitrogen-containing protective layer over a top and sidewalls of the fin structure. The method also includes forming a dummy gate electrode over the nitrogen-containing protective layer and forming a spacer element over a sidewall of the dummy gate electrode. The method further includes forming a dielectric layer surrounding the dummy gate electrode and removing the dummy gate electrode to form a trench exposing the nitrogen-containing protective layer. In addition, the method includes partially removing the nitrogen-containing protective layer to expose the fin structure and forming a metal gate stack wrapped around the fin structure.

20 Claims, 15 Drawing Sheets

STRUCTURE AND FORMATION METHOD OF SEMICONDUCTOR DEVICE WITH SEMICONDUCTOR NANOSTRUCTURES

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2 to 2J-2 are cross-sectional views of various stages of a process for forming a portion of a semiconductor device structure, in accordance with some embodiments.

FIGS. 2A-3 to 2J-3 are cross-sectional views of various stages of a process for forming a portion of a semiconductor device structure, in accordance with some embodiments.

FIGS. 3A-1 to 3B-1 are cross-sectional views of various stages of a process for forming a portion of a semiconductor device structure, in accordance with some embodiments.

FIGS. 3A-2 to 3B-2 are cross-sectional views of various stages of a process for forming a portion of a semiconductor device structure, in accordance with some embodiments.

FIGS. 3A-3 to 3B-3 are cross-sectional views of various stages of a process for forming a portion of a semiconductor device structure, in accordance with some embodiments.

DETAILED DESCRIPTION

Figure 1A:
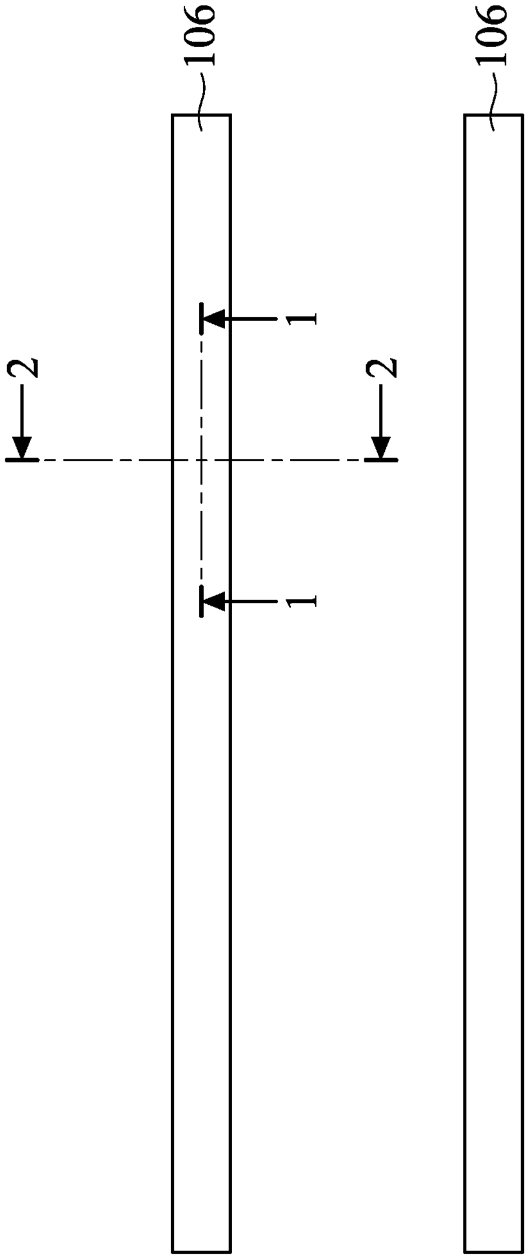
FIGS. 1A-1B are plan views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure may relate to FinFET structure having fins and/or gate all around (GAA) transistor structures (which include channel layers suspended over a substrate, where the channel layers are fabricated from semiconductor layers stacks (i.e., fins)). The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
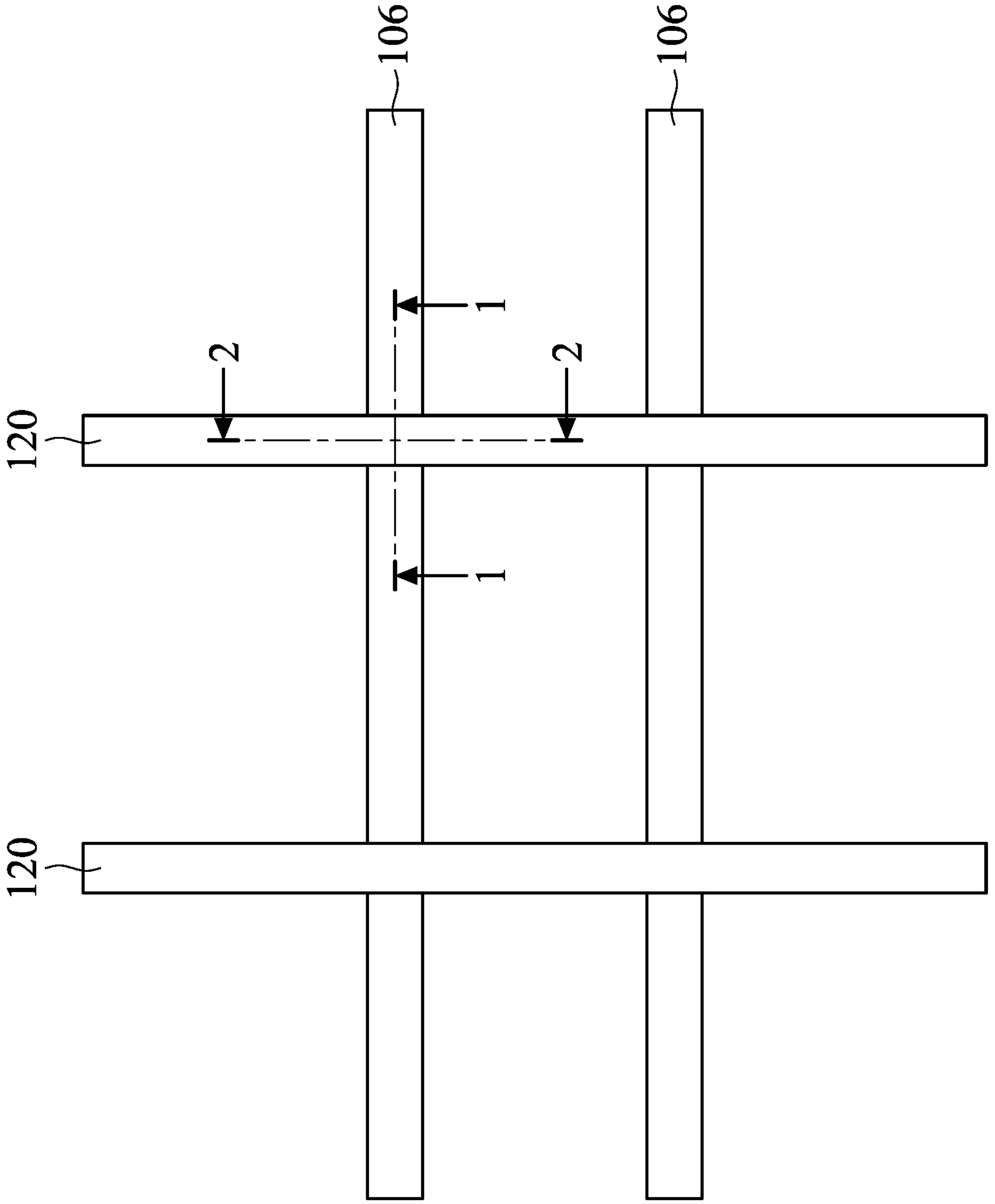

FIGS. 1A-1B are plan views of various stages of a process for forming a portion of a semiconductor device structure, in accordance with some embodiments. As shown in FIG. 1A, multiple fin structures 106 are formed, in accordance with some embodiments. In some embodiments, the fin structures 106 are oriented lengthwise. In some embodiments, the extending directions of the fin structures 106 are substantially parallel to each other, as shown in FIG. 1A.

Figures 2, 2A, 3:
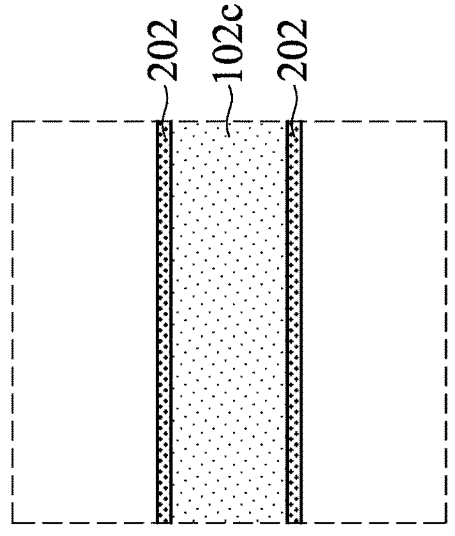
Figures 2, 2A:
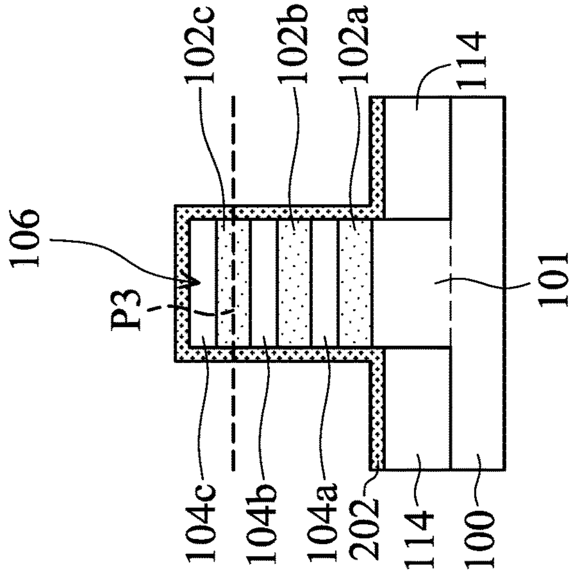
Figures 1, 2A:
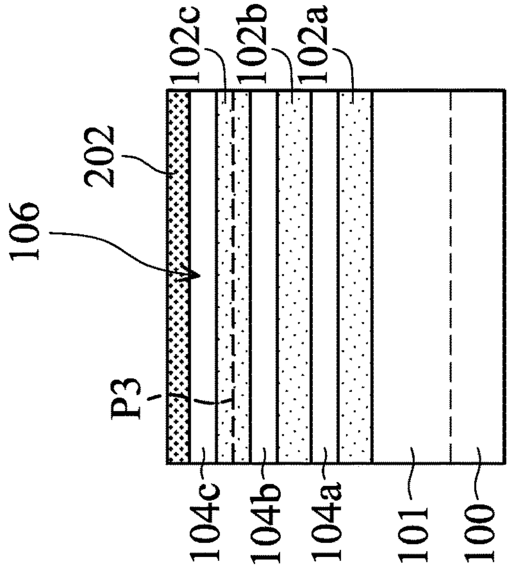
FIGS. 2A-1 to 2J-1 are cross-sectional views of various stages of a process for forming a portion of a semiconductor device structure, in accordance with some embodiments.
Figures 2, 2B, 3:
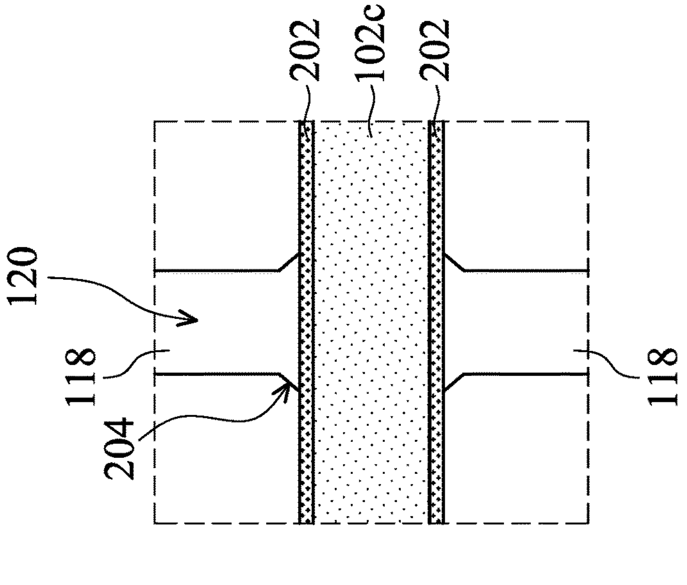
Figures 2, 2B:
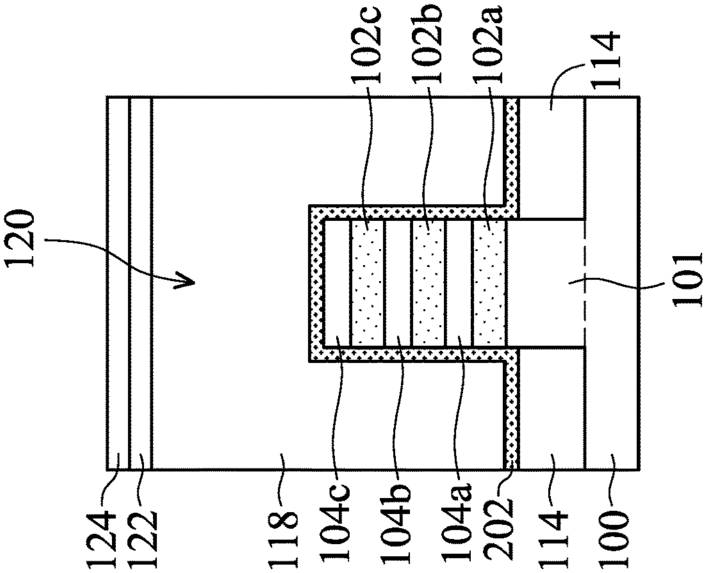
Figures 1, 2B:
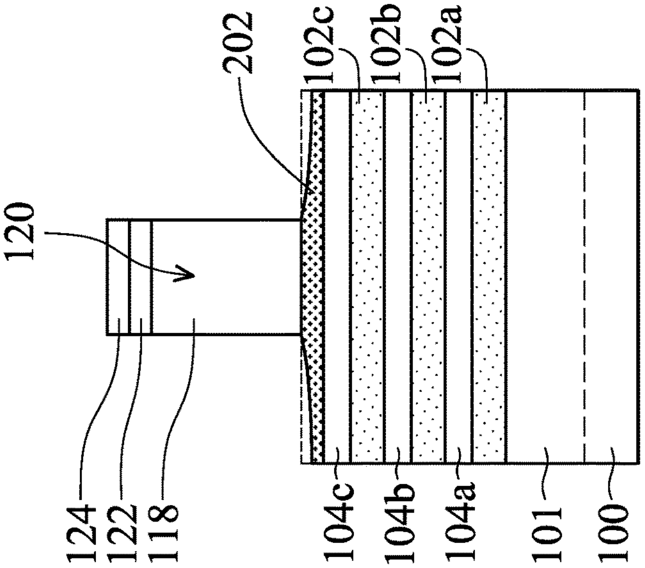
Figures 1, 2C:
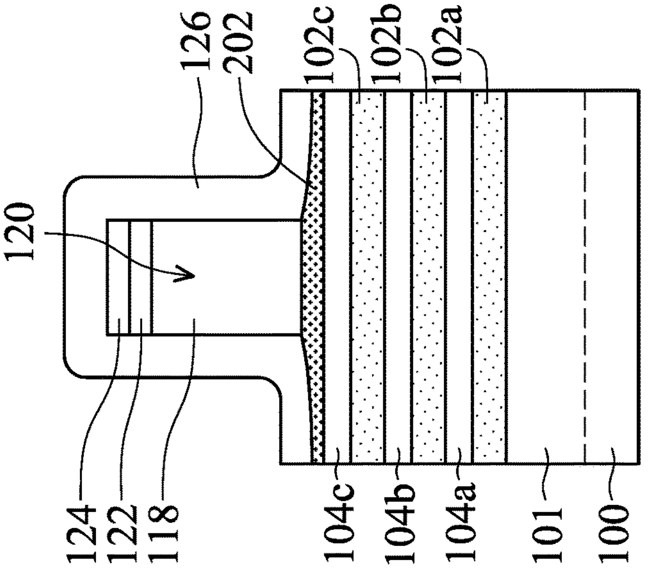
Figures 2, 2C:
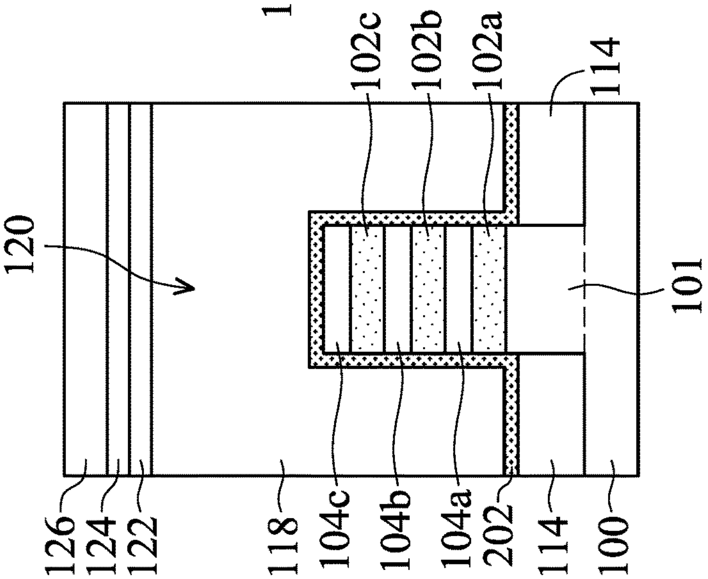
Figures 2, 2C, 3:
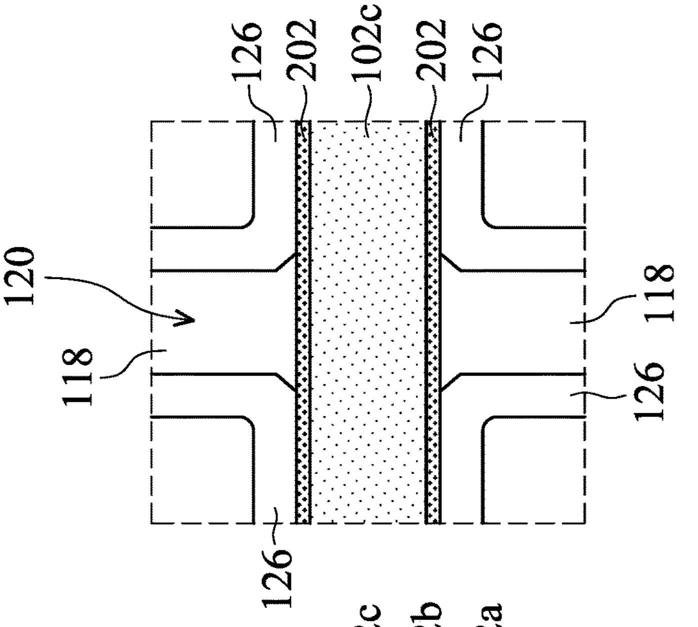
Figures 1, 2D:
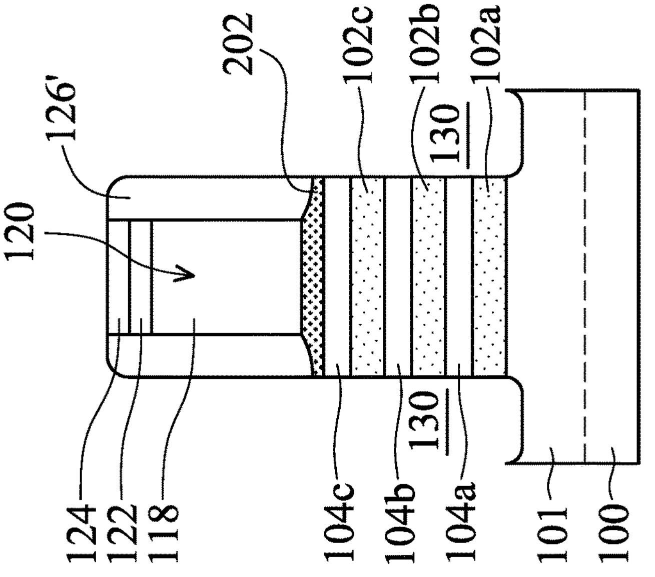
Figures 2, 2D:
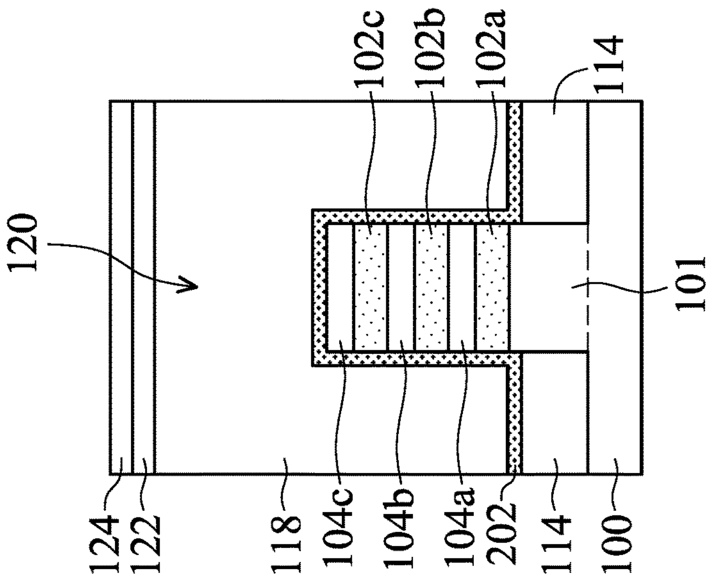
Figures 2, 2D, 3:
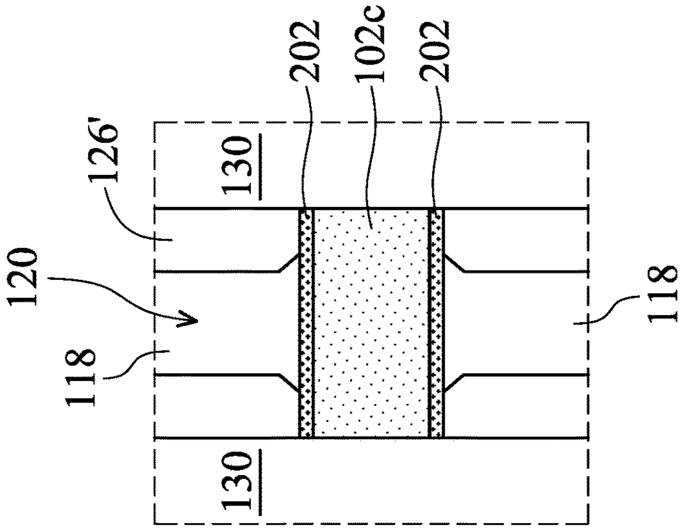
Figures 1, 2E:
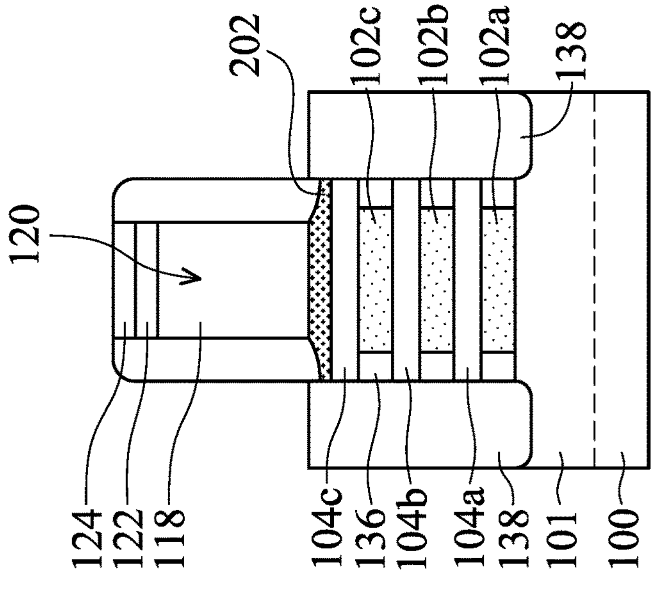
Figures 2, 2E:
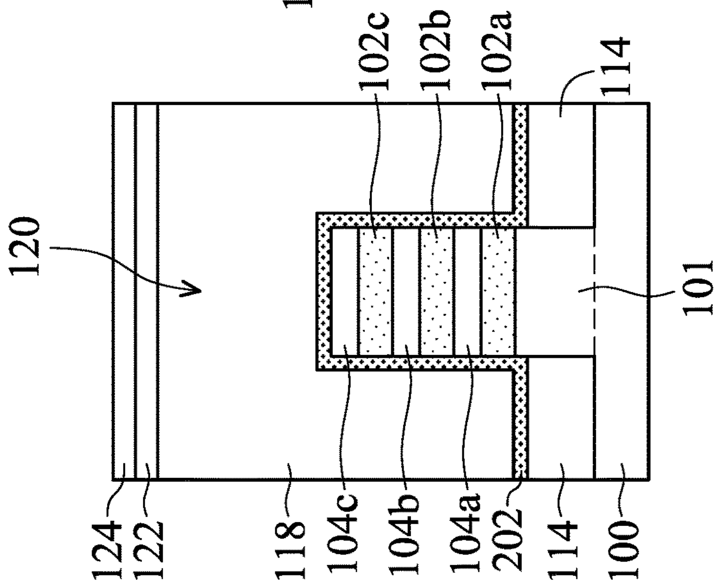
Figures 2, 2E, 3:
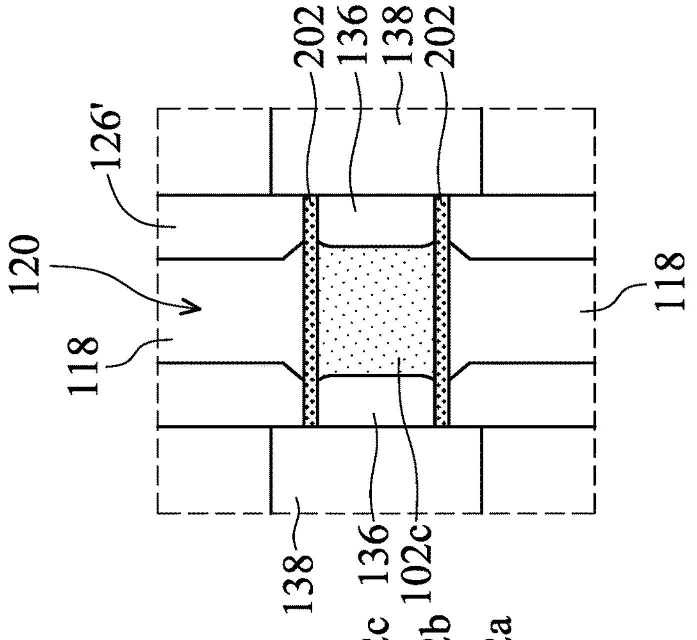
Figures 1, 2F:
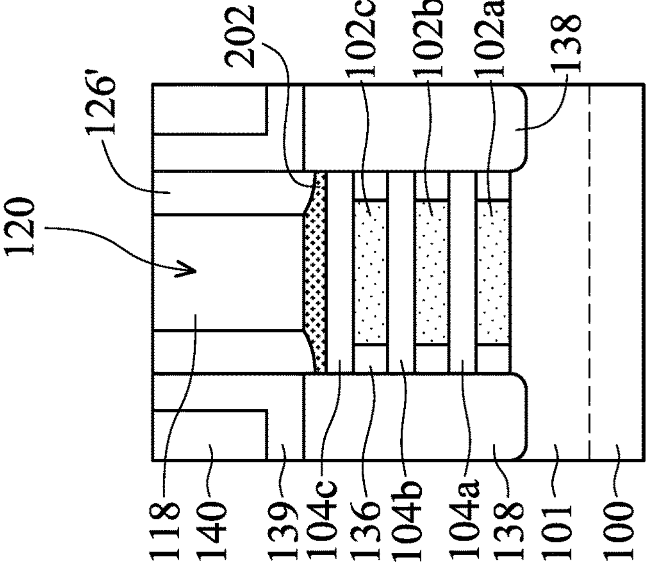
Figures 2, 2F:
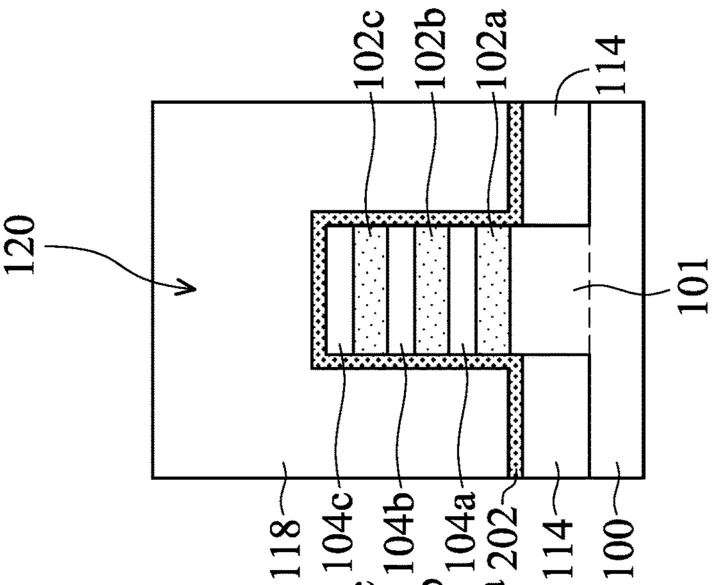
Figures 2, 2F, 3:
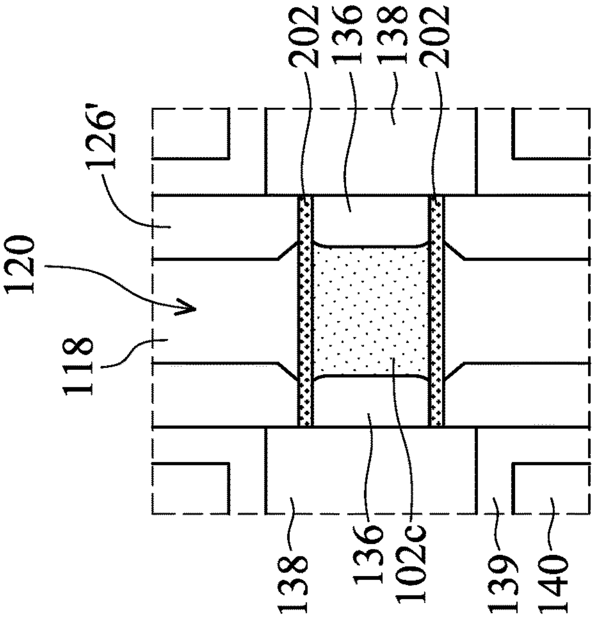
Figures 2, 2G, 3:
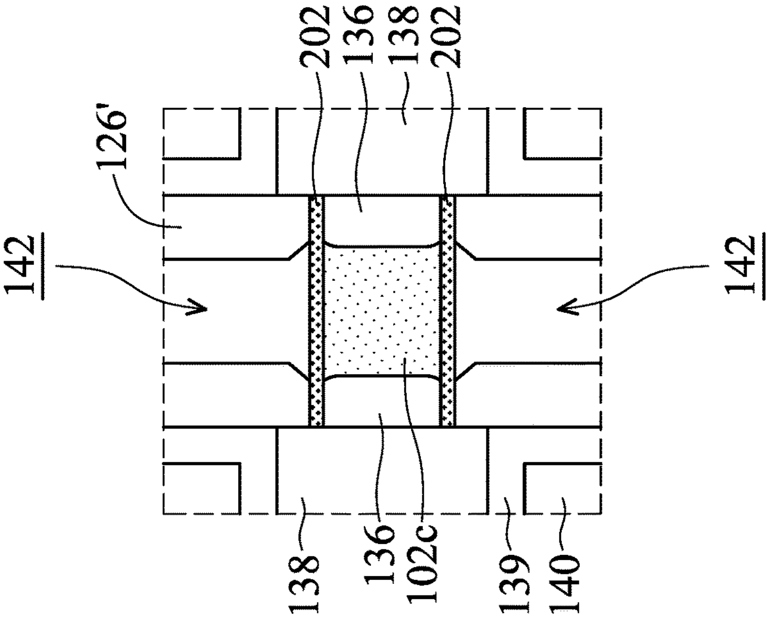
Figures 2, 2G:
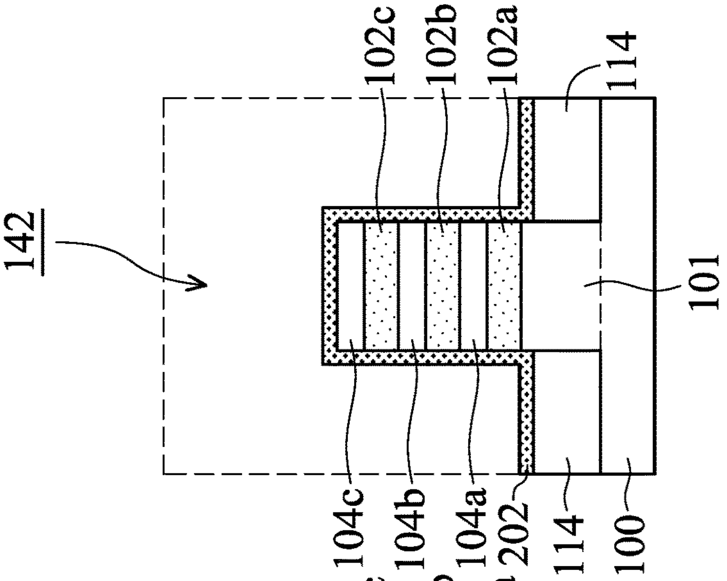
Figures 1, 2G:
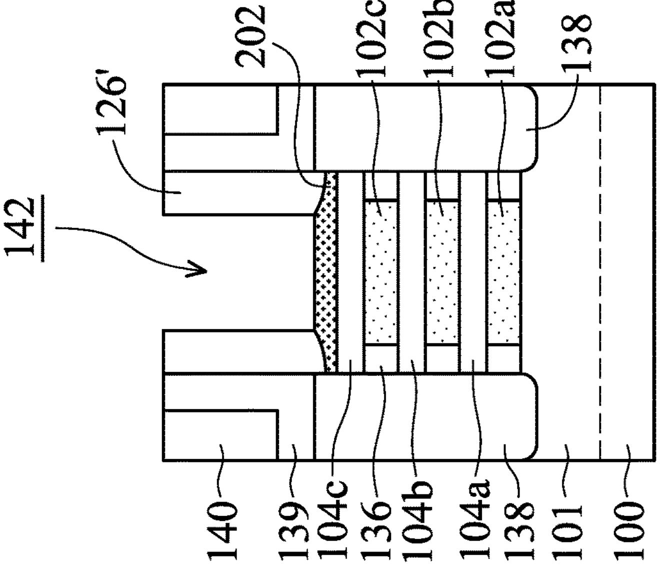
Figures 2, 2H, 3:
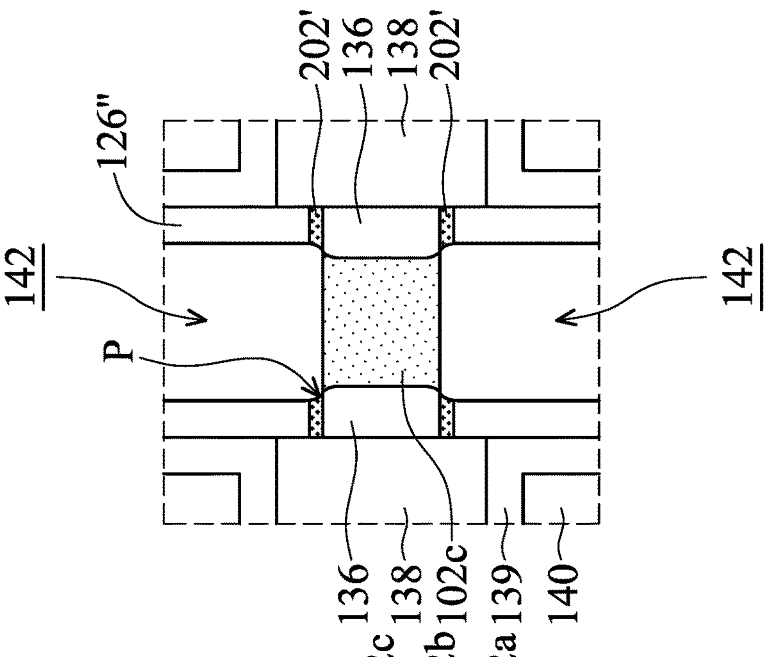
Figures 2, 2H:
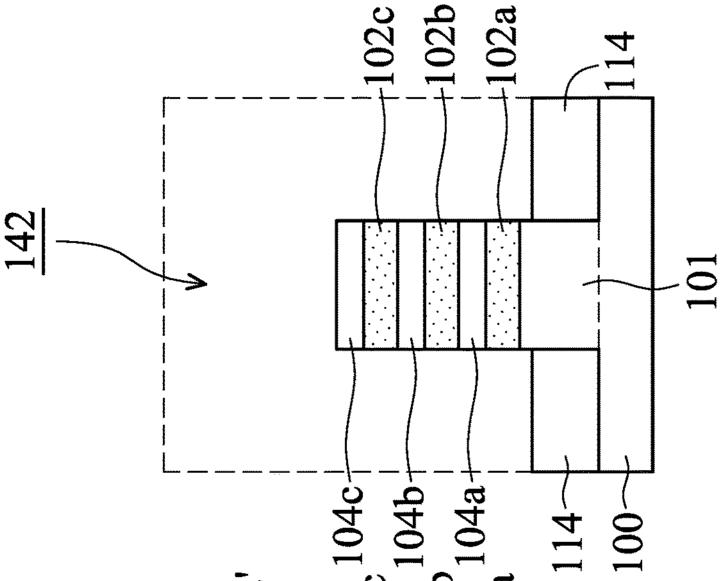
Figures 1, 2H:
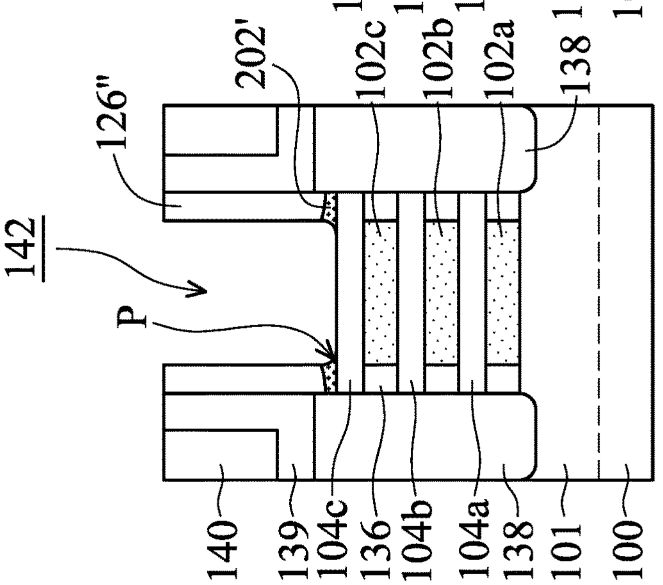
Figures 1, 2I:
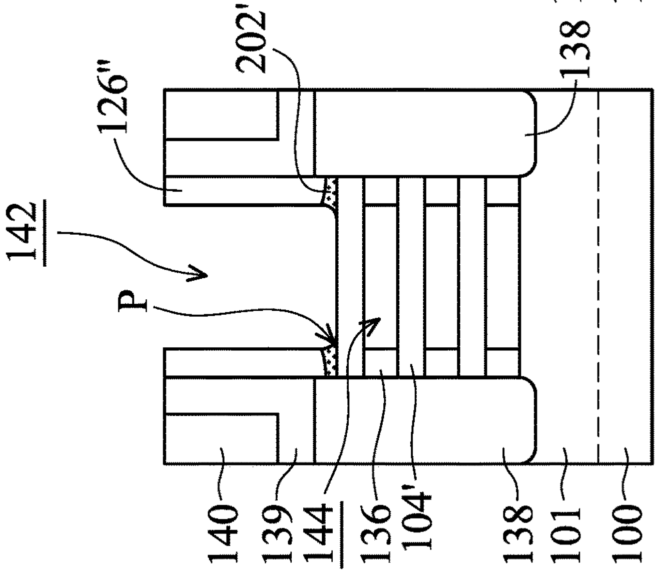
Figures 2, 2I:
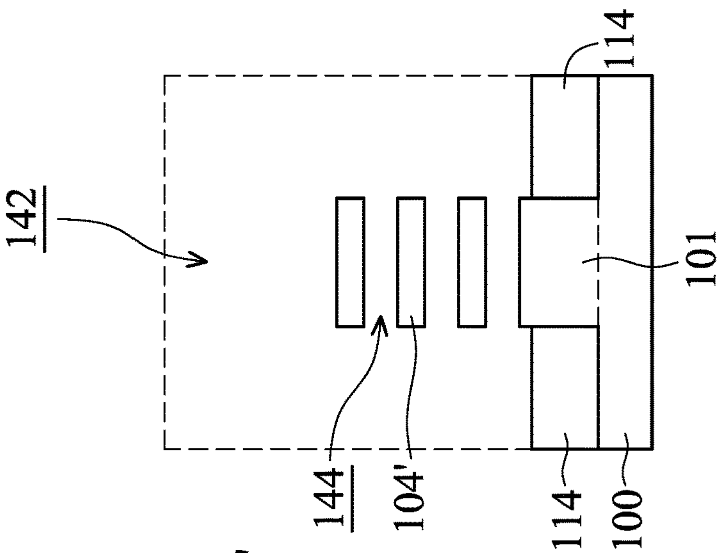
Figures 2, 2I, 3:
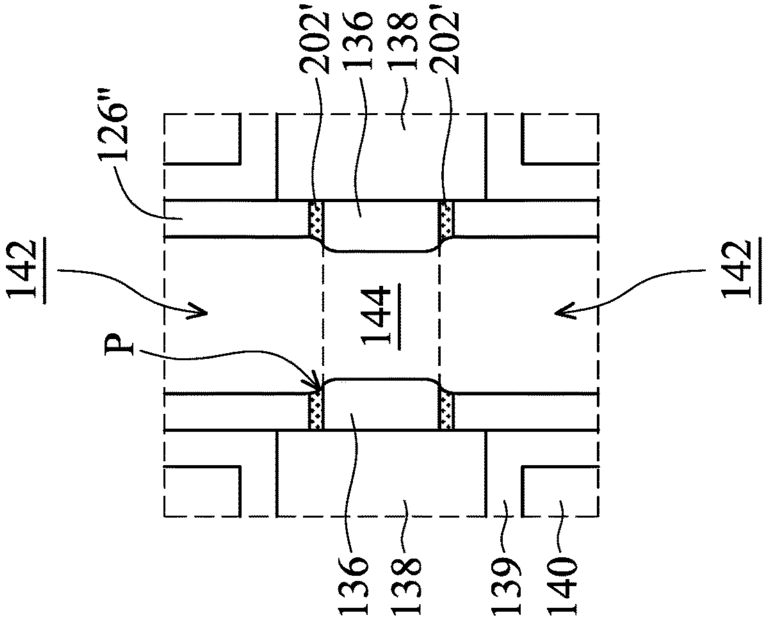
Figures 2, 2J, 3:
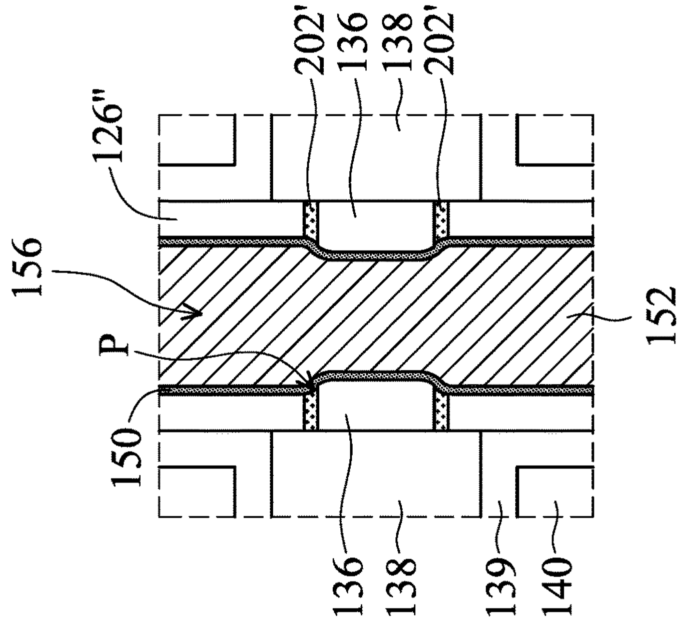
Figures 2, 2J:
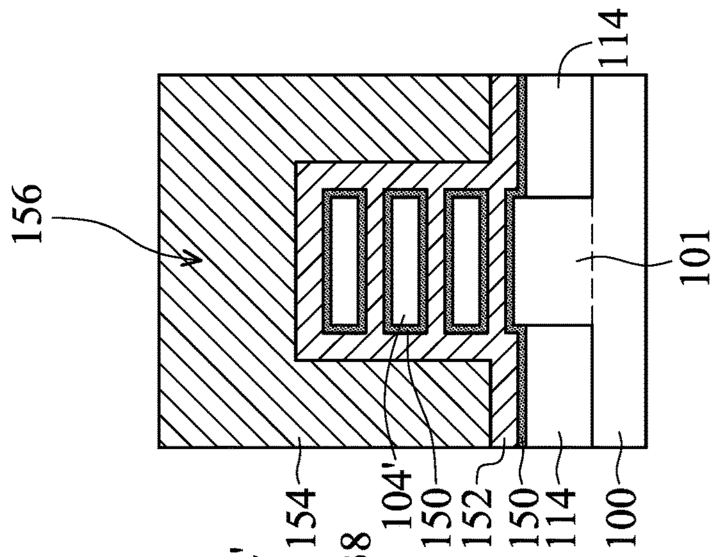
Figures 1, 2J:
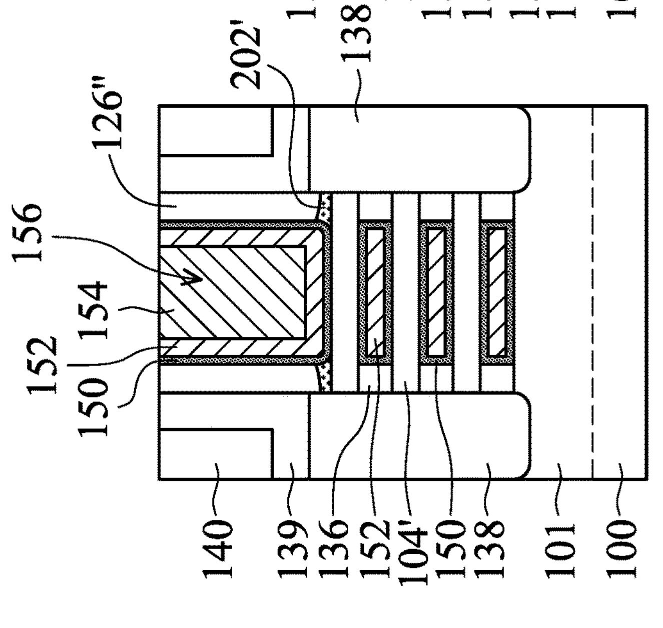

FIGS. 2A-1 to 2J-1 are cross-sectional views of various stages of a process for forming a portion of a semiconductor device structure, in accordance with some embodiments. FIGS. 2A-2 to 2J-2 are cross-sectional views of various stages of a process for forming a portion of a semiconductor device structure, in accordance with some embodiments. In some embodiments, FIG. 2A-1 is a cross-sectional view of a structure taken along the line 1-1 in FIG. 1A. In some embodiments, FIG. 2A-2 is a cross-sectional view of the structure taken along the line 2-2 in FIG. 1A.

In some embodiments, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

In some embodiments, a semiconductor stack having multiple semiconductor layers is formed over the semiconductor substrate 100. In some embodiments, the semiconductor stack includes multiple semiconductor layers 102*a*, 102*b*, and 102*c*. The semiconductor stack also includes multiple semiconductor layers 104*a*, 104*b*, and 104*c*. In some embodiments, the semiconductor layers 102*a*-102*c* and the semiconductor layers 104*a*-104*c* are laid out alternately. The semiconductor layers 102*a*-102*c* and the semiconductor layers 104*a*-104*c* have an alternating configuration.

In some embodiments, the semiconductor layers 102*a*-102*c* function as sacrificial layers that will be removed in a subsequent process to release the semiconductor layers 104*a*-104*c*. The semiconductor layers 104*a*-104*c*, that are released, form multiple semiconductor nanostructures that may function as channel structures of one or more transistors.

In some embodiments, the semiconductor layers 104*a*-104*c* that will be used to form channel structures are made of a material that is different than that of the semiconductor layers 102*a*-102*c*. In some embodiments, the semiconductor layers 104*a*-104*c* are made of or include silicon, germanium, one or more other suitable materials, or a combination thereof. In some embodiments, the semiconductor layers 102*a*-102*c* are made of or include silicon germanium. In some other embodiments, the semiconductor layers 104*a*-104*c* are made of silicon germanium, and the semiconductor layers 102*a*-102*c* are made of silicon germanium with different atomic concentration of germanium than that of the semiconductor layers 104*a*-104*c*. As a result, different etching selectivity and/or different oxidation rates during subsequent processing may be achieved between the semiconductor layers 102*a*-102*c* and the semiconductor layers 104*a*-104*c*.

The present disclosure contemplates that the semiconductor layers 102*a*-102*c* and the semiconductor layers 104*a*-104*c* include any combination of semiconductor materials that can provide desired etching selectivity, desired oxidation rate differences, and/or desired performance characteristics (e.g., materials with high current flow).

In some embodiments, the semiconductor layers 102*a*-102*c* and 104*a*-104*c* are formed using multiple epitaxial growth operations. Each of the semiconductor layers 102*a*-102*c* and 104*a*-104*c* may be formed using a selective epitaxial growth (SEG) process, a chemical vapor deposition (CVD) process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the semiconductor layers 102*a*-102*c* and 104*a*-104*c* are grown in-situ in the same process chamber. In some embodiments, the growth of the semiconductor layers 102*a*-102*c* and 104*a*-104*c* are alternately and sequentially performed in the same process chamber to complete the formation of the semiconductor stack. In some embodiments, the vacuum of the process chamber is not broken before the epitaxial growth of the semiconductor stack is accomplished.

In some embodiments, hard mask elements are formed over the semiconductor stack to assist in a subsequent patterning of the semiconductor stack. Each of the hard mask elements may include a first mask layer and a second mask layer. The first mask layer and the second mask layer may be made of different materials. One or more photolithography processes and one or more etching processes are used to pattern the semiconductor stack. As a result, the fin structures 106 are formed, as shown in FIGS. 1A, 2A-1, and 2A-2.

The fin structures 106 may be patterned by any suitable method. For example, the fin structures 106 may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

Each of the fin structures 106 may include portions of the semiconductor layers 102*a*-102*c* and 104*a*-104*c* and a semiconductor fin 101, as shown in FIGS. 2A-1 and 2A-2. The semiconductor substrate 100 may also be partially removed during the etching process that forms the fin structures 106. Protruding portions of the semiconductor substrate 100 that remain form the semiconductor fin 101, as shown in FIGS. 2A-1 and 2A-2. The semiconductor fin 101 may have a fin height that is within a range from about 30 nm to about 100 nm.

In some embodiments, an isolation structure 114 is formed to surround the lower portion of the fin structure 106, as shown in FIG. 2A-2. The fin structure 106 protrudes from the top surface of the isolation structure 114.

In some embodiments, one or more insulating layers are deposited over the fin structure 106 and the semiconductor substrate 100. The insulating layers may be made of or include silicon oxide, silicon oxynitride, carbon-containing silicon oxide, carbon-containing silicon oxynitride, silicon nitride, another suitable material, or a combination thereof. The insulating layers may be deposited using a chemical vapor deposition (CVD) process, a flowable chemical vapor deposition (FCVD) process, an atomic layer deposition (ALD) process, another applicable process, or a combination thereof.

Afterwards, a planarization process is used to partially remove the insulating layers. The hard mask elements (including the first mask layer and the second mask layer) used for defining the fin structures 106 may also function as a stop layer of the planarization process. The planarization process may include a chemical mechanical polishing (CMP) process, a grinding process, a dry polishing process, an etching process, one or more other applicable processes, or a combination thereof.

Afterwards, one or more etching back processes are used to remove the upper portions of the insulating layers. As a result, the remaining portion of the insulating layers forms the isolation structure 114, as shown in FIG. 2A-2. The upper portion of the fin structure 106 protrudes from the top surface of the isolation structure 114.

In some embodiments, the etching back process for forming the isolation structure 114 is carefully controlled to ensure that the topmost surface of the isolation structure 114 is positioned at a suitable height level, as shown in FIG. 2A-2. In some embodiments, the topmost surface of the isolation structure 114 is below the bottommost surface of the semiconductor layer 102*a* that functions as a sacrificial layer.

Afterwards, the hard mask elements (including the first mask layer and the second mask layer) on the fin structures 106 are removed. Alternatively, in some other embodiments, the hard mask elements are removed or consumed during the planarization process and/or the etching back process that forms the isolation structure 114.

Afterwards, a protective layer 202 is deposited over the top and sidewalls of the fin structure 106, as shown in FIGS. 2A-1 and 2A-2 in accordance with some embodiments. The protective layer 202 further extends over the isolation structure 114, as shown in FIG. 2A-2. The protective layer 202 may prevent the fin structure 106 thereunder from being damaged during a subsequent etching process for forming dummy gate stacks.

FIGS. 2A-3 to 2J-3 are cross-sectional views of various stages of a process for forming a portion of a semiconductor device structure, in accordance with some embodiments. In some embodiments, FIG. 2J-3 is a cross-sectional view of the structure taken along the line P3 in FIG. 2A-1 and along the line P3 in FIG. 2A-2. In some embodiments, the protective layer 202 covers opposite edges of the semiconductor layer 102*c*, as shown in FIGS. 2A-2 and 2A-3.

In some embodiments, the protective layer 202 contains nitrogen and/or carbon. The protective layer 202 may be made of or include carbon-containing silicon oxynitride (SiCON), carbon-containing silicon oxide (SiCO), carbon-containing silicon nitride (SiCN), silicon oxynitride (SiON), silicon nitride (SiN), another suitable material, or a combination thereof. In some embodiments, the protective layer 202 is not made of silicon oxide that does not contain nitrogen or carbon. The protective layer 202 may be deposited using a CVD process, an ALD process, another applicable process, or a combination thereof.

As shown in FIGS. 1B, 2B-1, 2B-2, and 2B-3, dummy gate stacks 120 are formed extending across the fin structures 106, in accordance with some embodiments. The dummy gate stacks 120 are formed to partially cover and to extend across the fin structures 106, in accordance with some embodiments. In some embodiments, the dummy gate stacks 120 are wrapped around the fin structures 106. As shown in FIGS. 1B, 2B-1, and 2B-3, some portions of the fin structure 106 are not covered by the dummy gate stack 120.

As shown in FIGS. 2B-1, 2B-2, and 2B-3, the dummy gate stack 120 includes a dummy gate electrode 118. The dummy gate electrode 118 may be made of or include polysilicon or another suitable material. In some embodiments, a dummy gate electrode layer is deposited over the protective layer 202. The dummy gate electrode layer may be deposited using a CVD process. Afterwards, the dummy gate electrode layer is patterned to form the dummy gate electrode 118.

In some embodiments, a hard mask element including mask layers 122 and 124 is used to assist in the patterning process for forming the dummy gate stack 120. With the hard mask element as an etching mask, one or more etching processes are used to partially remove the dummy gate electrode layer. As a result, the remaining portion of the dummy gate electrode layer forms the dummy gate electrode 118 of the dummy gate stack 120. In some embodiments, the dummy gate electrode 118 has protruding portions 204 near protective layer 202, as shown in FIG. 2B-3.

During the etching process for forming the dummy gate stack 120, the protective layer 202 covers the fin structure 106 thereunder, so as to prevent the fin structure 106 from being etched. Due to the block of the protective layer 202, the etchants used in the etching process are prevented from reaching the fin structure 106. The top surface of the semiconductor layer 104*c* is prevented from being recessed. As mentioned above, the semiconductor layer 104*c* may be formed into channel structures. Due to the protection of the protective layer 202, the quality and reliability of the channel structures may be significantly improved.

In some embodiments, the protective layer 202 is partially etched by the etching process used for forming the dummy gate stack 120. As a result, the protective layer 202 is recessed, as shown in FIG. 2B-1. In some embodiments, the protective layer 202 thus has a curved upper surface. In some embodiments, the curved upper surface of the protective layer 202 has a curvature center that is outside of the protective layer 202.

As shown in FIGS. 2C-1, 2C-2, and 2C-3, a spacer layer 126 is then deposited over the dummy gate stack 120 and the protective layer 202, in accordance with some embodiments. The spacer layer 126 extends along the tops and sidewalls of the dummy gate stack 120, as shown in FIGS. 2C-1, 2C-2, and 2C-3. The spacer layer 126 further extend over the portions of the protective layer 202 that are not covered by the dummy gate stack 120.

In some embodiments, the spacer layer 126 is a single layer. In some other embodiments, the spacer layer 126 includes multiple sub-layers. The spacer layer 126 may be made of or include silicon carbide, silicon oxycarbide, carbon-containing silicon oxynitride, silicon oxide, one or more other suitable materials, or a combination thereof. Some of the sub-layers may be made of different materials. Some of the sub-layers may be made of similar materials with different compositions. For example, one of the sub-layers may have a greater atomic concentration of carbon or nitrogen than those of other sub-layers. In some other embodiments, the sub-layers are made of the same material. The spacer layer 126 may be deposited using a CVD process, an ALD process, a physical vapor deposition (PVD) process, another applicable process, or a combination thereof.

As shown in FIGS. 2D-1, 2D-2, and 2D-3, the spacer layer 126 is partially removed, in accordance with some embodiments. One or more anisotropic etching processes may be used to partially remove the spacer layer 126. As a result, some remaining portions of the spacer layer 126 form spacer elements 126'. The spacer elements 126' extend along the sidewalls of the dummy gate stacks 120, as shown in FIGS. 2D-1 and 2D-3.

Afterwards, the fin structures 106 are partially removed, in accordance with some embodiments. The portions of the fin structures 106 not covered by the dummy gate stacks 120 are recessed. As a result, multiple recesses 130 are formed, as shown in FIGS. 2D-1 and 2D-3. The recesses 130 may be used to contain epitaxial structures (that may function as source/drain structures) that will be formed later.

One or more etching processes may be used to form the recesses 130. In some embodiments, a dry etching process is used to form the recesses 130. Alternatively, a wet etching process may be used to form the recesses 130. In some embodiments, the recesses 130 penetrate into the fin structure 106. In some embodiments, the recesses 130 further extend into the semiconductor fin 101, as shown in FIG. 2D-1. In some embodiments, the spacer elements 126' and the recesses 130 are formed simultaneously in the same process chamber.

In some embodiments, the recesses 130 have substantially vertical sidewalls. In these cases, due to the profile of the recesses 130, the upper semiconductor layer (such as the semiconductor layer 104*c*) is substantially as wide as the lower semiconductor layer (such as the semiconductor layer 104*b*).

However, embodiments of the disclosure have many variations. In some other embodiments, each of the recesses 130 has slanted sidewalls. Upper portions of the recesses 130 are larger (or wider) than lower portions of the recesses 130. In these cases, due to the profile of the recesses 130, the upper semiconductor layer (such as the semiconductor layer 104*c*) is shorter than the lower semiconductor layer (such as the semiconductor layer 104*b*).

Afterwards, as shown in FIGS. 2E-1 and 2E-3, the semiconductor layers 102*a*-102*c* are laterally etched, in accordance with some embodiments. As a result, edges of the semiconductor layers 102*a*-102*c* retreat from edges of the semiconductor layers 104*a*-104*c*. As shown in FIGS. 2E-1 and 2E-3, recesses are formed due to the lateral etching of the semiconductor layers 102*a*-102*c*. The recesses may be used to contain inner spacers that will be formed later.

The semiconductor layers 102*a*-102*c* may be laterally etched using a wet etching process, a dry etching process, or a combination thereof. In some other embodiments, the semiconductor layers 102*a*-102*c* are partially oxidized before being laterally etched. As shown in FIG. 2E-2, other portions of the semiconductor layers 102*a*-102*c* are covered by the protective layer 202 and the dummy gate stack 120, and thus are not recessed, in accordance with some embodiments.

Afterwards, an insulating layer is deposited to overfill the recesses, in accordance with some embodiments. The insulating layer covers the dummy gate stacks 120 and fills the recesses. In some embodiments, the insulating layer is a single layer. In some other embodiments, the insulating layer includes multiple sub-layers. Some of the sub-layers may be made of different materials and/or contain different compositions.

The insulating layer may be made of or include carbon-containing silicon nitride (SiCN), carbon-containing silicon oxynitride (SiOCN), carbon-containing silicon oxide (SiOC), silicon oxide, silicon nitride, one or more other suitable materials, or a combination thereof. The insulating layer may be deposited using a CVD process, an ALD process, one or more other applicable processes, or a combination thereof.

Afterwards, an etching process is used to partially remove the insulating layer, in accordance with some embodiments. The portions of the insulating layer that are outside of the recesses may be removed. The remaining portions of the insulating layer form inner spacers 136, as shown in FIGS. 2E-1 and 2E-3. The etching process may include a dry etching process, a wet etching process, or a combination thereof.

The inner spacers 136 cover the edges of the semiconductor layers 102*a*-102*c*. The inner spacers 136 may be used to prevent subsequently formed epitaxial structures (that function as, for example, source/drain structures) from being damaged during a subsequent process for removing the sacrificial layers 102*a*-102*c*.

In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

Afterwards, as shown in FIGS. 2E-1 and 2E-3, epitaxial structures 138 are formed, in accordance with some embodiments. In some embodiments, the epitaxial structures 138 overfill the recesses 130 to ensure full contact between the epitaxial structures 138 and the semiconductor layer 104*c*. In some embodiments, the top surfaces of the epitaxial structures 138 are higher than the top surface of the protective layer 202. In some other embodiments, the epitaxial structures 138 partially fill the recesses 130.

In some embodiments, the epitaxial structures 138 connect to the semiconductor layers 104*a*-104*c*. Portions of the semiconductor layers 104*a*-104*c*, that will be function as channel structures, are sandwiched between two respective epitaxial structures 138, as shown in FIG. 2E-1. In some embodiments, the epitaxial structures 138 are designed to function as source/drain structures of p-channel field-effect transistors (PFET). The epitaxial structures 138 may include epitaxially grown silicon germanium (SiGe), epitaxially grown silicon, or another suitable epitaxially grown semiconductor material.

In some other embodiments, the epitaxial structures 138 are designed to function as source/drain structures of n-channel field-effect transistors (NFET). The epitaxial structures 138 may include epitaxially grown silicon or another suitable epitaxially grown semiconductor material. The source/drain structure(s) may refer to a source structure or a drain structure, individually or collectively dependent upon the context.

In some embodiments, the epitaxial structures 138 are designed to function as source/drain structures of p-channel field-effect transistors (PFET). In these cases, the epitaxial structure 138 is p-type doped. In some embodiments, the epitaxial structures 138 is doped with one or more suitable p-type dopants. For example, the epitaxial structures 138 is a SiGe source/drain feature or a Si source/drain feature that is doped with boron (B), gallium (Ga), indium (In), or another suitable dopant.

In some embodiments, the epitaxial structures 138 are designed to function as source/drain structures of n-channel field-effect transistors (NFET). In these cases, the epitaxial structure 138 is n-type doped. In some embodiments, the epitaxial structures 138 is doped with one or more suitable n-type dopants. For example, the epitaxial structures 138 is a Si source/drain feature that is doped with phosphor (P), antimony (Sb), arsenic (As), or another suitable dopant.

In some embodiments, the epitaxial structures 138 are formed using multiple epitaxial growth operations. In some embodiments, these epitaxial growth operations are performed in-situ in the same process chamber. In some embodiments, the vacuum of the process chamber is not broken before the formation of the epitaxial structures 138 is accomplished. The reaction gases may be varied in the reaction chamber during the epitaxial growth operations.

These epitaxial growth operations may be achieved using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the formation of the epitaxial structures 138 involves one or more etching processes that are used to fine-tune the shapes of the epitaxial structures 138.

In some embodiments, the epitaxial structures 138 are doped in-situ during their epitaxial growth. The initial reaction gas mixture for forming the epitaxial structures 138 contains respective dopants. In some embodiments, the epitaxial structures 138 are further exposed to one or more annealing processes to activate the dopants. For example, a rapid thermal annealing process is used. During the one or more annealing processes, the sacrificial structure 210' remains stable.

Figure 4B:
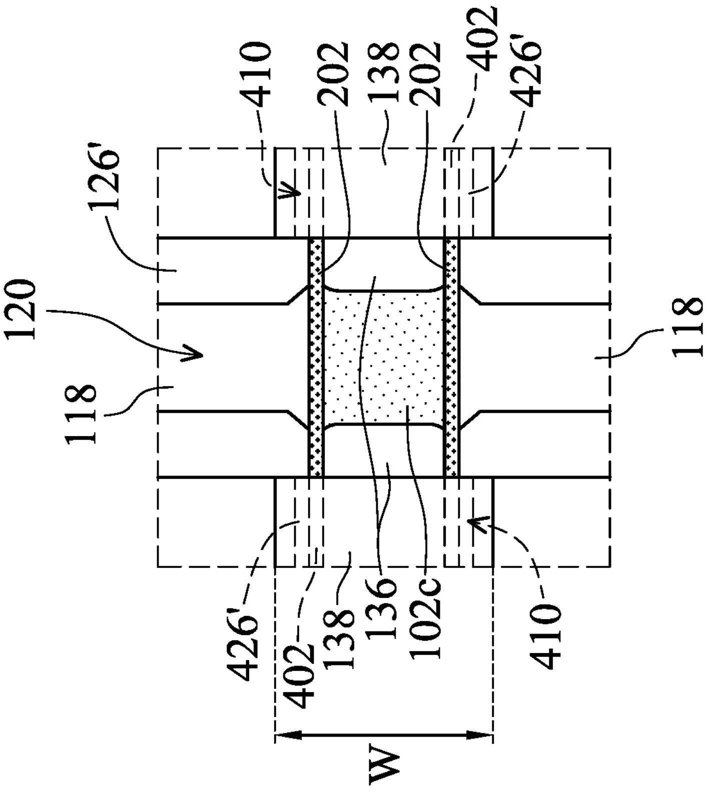
FIGS. 4A-4B are cross-sectional views of various stages of a process for forming a portion of a semiconductor device structure, in accordance with some embodiments.
Figure 4A:
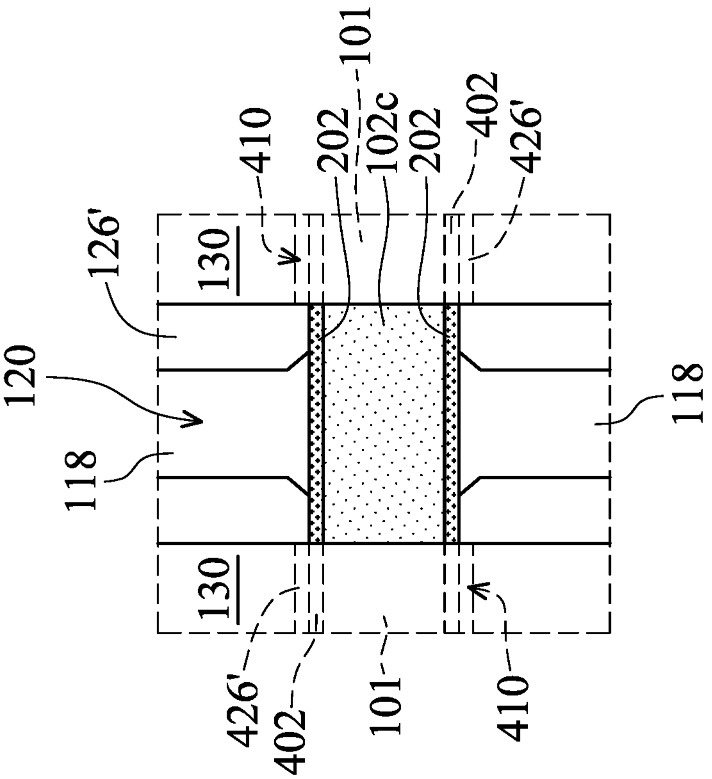

FIGS. 4A-4B are cross-sectional views of various stages of a process for forming a portion of a semiconductor device structure, in accordance with some embodiments. In some embodiments, FIG. 4A shows the cross-sectional view of a structure that is similar to the structure shown in FIG. 2D-3.

In some embodiments, after the etching process for forming the recesses 130, some remaining portions of the protective layer 202 form multiple first isolation structures 402 in the recesses 130. Each of the first isolation structures 402 is positioned at a lower height level than the protective layer 202. Therefore, the first isolation structures 402 are illustrated as dashed lines in FIG. 4A.

In some embodiments, after the etching process for forming the recesses 130, some remaining portions of the spacer layer 126 form multiple second isolation structures 426' in the recesses 130. Each of the second isolation structures 426' is positioned at a lower height level than the spacer element 126'. Therefore, the second isolation structures 426' are illustrated as dashed lines in FIG. 4A.

As shown in FIG. 4A, the first isolation structures 402 and the second isolation structures 426' together form multiple spacer structures 410. The spacer structures 410 are positioned beside the fin structure 106. In some embodiments, the semiconductor fin 101 between the spacer structures 410 is also exposed by the recesses 130, as shown in FIG. 4A.

In some embodiments, FIG. 4B shows a cross-sectional view of a structure that is similar to the structure shown in FIG. 2E-3. Similar to the embodiments illustrated in FIGS. 2E-1, 2E-2, and 2E-3, the epitaxial structures 138 are formed, as shown in FIG. 4B in accordance with some embodiments. In some embodiments, due to the confinement of the spacer structures 410, the growth of the epitaxial structures 138 is limited. As a result, each of the epitaxial structures 138 is limited to having a width W, as shown in FIG. 4B. The epitaxial structures 138 are thus prevented from being merged with other nearby epitaxial structures 138 that are arranged along the same side of the dummy gate stack 120. The performance and reliability of the semiconductor device structure are improved.

Afterwards, as shown in FIGS. 2F-1, 2F-2, and 2F-3, a contact etch stop layer 139 and a dielectric layer 140 are formed to cover the epitaxial structures 138 and to surround the dummy gate stack 120, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer respectively form the contact etch stop layer 139 and the dielectric layer 140, as shown in FIGS. 2F-1 and 2F-3. The planarization process may include a CMP process, a grinding process, an etching process, a dry polishing process, one or more other applicable processes, or a combination thereof.

In some embodiments, the mask layers 122 and 124 that are originally positioned over the dummy gate stack 120 are also removed during the planarization process, as shown in FIGS. 2F-1 and 2F-2. In some embodiments, after the planarization process, the top surfaces of the contact etch stop layer 139, the dielectric layer 140, and the dummy gate electrodes 118 are substantially level, as shown in FIG. 2F-1.

As shown in FIGS. 2G-1, 2G-2, and 2G-3, the dummy gate electrode 118 is removed to form a trench 142 using one or more etching processes, in accordance with some embodiments. The trench 142 is surrounded by the dielectric layer 140. The trench 142 exposes the protective layer 202.

As shown in FIGS. 2H-1, 2H-2, and 2H-3, the protective layer 202 is partially removed, in accordance with some embodiments. As a result, the remaining portions of the protective layer 202 form multiple protective elements 202'. One or more etching processes may be used to partially remove the protective layer 202.

In some embodiments, each of the protective elements 202' is in direct contact with the epitaxial structure 138 that is nearby, as shown in FIGS. 2H-1 and 2H-3. In some embodiments, some of the protective elements 202' are in direct contact with the inner spacers 136 that are nearby, as shown in FIG. 2H-3.

As shown in FIGS. 2H-1 and 2H-3, the spacer elements 126' are also partially removed to form multiple modified spacer elements 126", in accordance with some embodiments. After the formation of the modified spacer elements 126", the trench 142 becomes wider and larger, which facilitate the subsequent formation of metal gate stacks. In some embodiments, one or more etching processes are used to form the modified spacer elements 126".

In some embodiments, the partial removal of the protective layer 202 and the partial removal of the spacer elements 126' are performed simultaneously. In some embodiments, the protective layer 202 and the spacer elements 126' are trimmed using an etching process that includes multiple dry etching operations and multiple wet etching operations.

The dry etching operations may involve introducing oxygen-containing plasma, and the wet etching operations may involve applying diluted hydrofluoric acid. In some embodiments, the dry etching operations and the wet etching operations are performed alternately, so as to fine-tune the profiles of the protective elements 202' and the modified spacer elements 126".

In some embodiments, the protective layer 202 and the spacer elements 126' are made of different materials. Therefore, after the etching process, the protective elements 202' and the modified spacer elements 126" may have different profiles.

In some embodiments, the modified spacer elements 126" have a higher atomic concentration of carbon than that of the protective elements 202'. In some embodiments, the modified spacer elements 126" have a lower atomic concentration of nitrogen than that of the protective elements 202'. In some other embodiments, the modified spacer elements 126" have an atomic concentration of nitrogen that is substantially equal to that of the protective elements 202'. In some embodiments, the modified spacer elements 126" have a lower atomic concentration of oxygen than that of the protective elements 202'.

In some embodiments, each of the protective elements 202' has a protruding portion P, as shown in FIGS. 2H-1 and 2H-3. In some embodiments, the protruding portion P laterally extends across the interior sidewall of the modified spacer element 126" thereabove, as shown in FIGS. 2H-1 and 2H-3. In some embodiments, due to the protruding portion P, the protective element 202' is wider than the modified spacer element 126" thereabove.

In some embodiments, the protruding portion P has a curved surface, as shown in FIGS. 2H-1 and 2H-3. In some embodiments, the curvature center of the curved surface of the protruding portion P is positioned outside of the protective element 202'. In some embodiments, the curvature center of the curved surface of the protruding portion P is positioned within the trench 142.

As shown in FIGS. 2I-1, 2I-2, and 2I-3, the semiconductor layers 102*a*-102*c* (that function as sacrificial layers) are removed, in accordance with some embodiments. In some embodiments, one or more etching processes are used to remove the semiconductor layers 102*a*-102*c*. As a result, recesses 144 are formed, as shown in FIGS. 2I-1, 2I-2, and 2I-3.

Due to high etching selectivity, the semiconductor layers 104*a*-104*c* are slightly (or substantially not) etched. The remaining portions of the semiconductor layers 104*a*-104*c* form multiple semiconductor nanostructures 104'. The semiconductor nanostructures 104' are constructed by or made up of the remaining portions of the semiconductor layers 104*a*-104*c*. The semiconductor nanostructures 104' may function as channel structures of transistors. In some embodiments, some of the protective elements 202' are in direct contact with the top surface of the topmost semiconductor nanostructure 104', as shown in FIG. 2I-1.

In some embodiments, the etchant used for removing the semiconductor layers 102*a*-102*c* also slightly removes the semiconductor layers 104*a*-104*c* that form the semiconductor nanostructures 104'. As a result, the obtained semiconductor nanostructures 104' become thinner after the removal of the semiconductor layers 102*a*-102*c*.

After the removal of the semiconductor layers 102*a*-102*c* (that function as sacrificial layers), the recesses 144 are formed. The recesses 144 connect to the trench 142 and surround each of the semiconductor nanostructures 104'. As shown in FIG. 2I-1, even if the recesses 144 between the semiconductor nanostructures 104' are formed, the semiconductor nanostructures 104' remain held by the epitaxial structures 138. Therefore, after the removal of the semiconductor layers 102*a*-102*c* (that function as sacrificial layers), the released semiconductor nanostructures 104' are prevented from falling.

During the removal of the semiconductor layers 102*a*-102*c* (that function as sacrificial layers), the inner spacers 136 and the protective elements 202' together protect the epitaxial structures 138 from being etched or damaged, as shown in FIGS. 2I-1 and 2I-3. The quality and reliability of the semiconductor device structure are ensured.

As shown in FIGS. 2J-1, 2J-2, and 2J-3, a metal gate stack 156 is formed to fill the trench 142, in accordance with some embodiments. The metal gate stack 156 further extends into the recesses 144, so as to be wrapped around each of the semiconductor nanostructures 104', as shown in FIGS. 2J-1 and 2J-2. In some embodiments, the metal gate stack 156 is in direct contact with the protective elements 202' and the spacer elements 136, as shown in FIGS. 2J-1 and 2J-3.

The metal gate stack 156 includes multiple metal gate stack layers. The metal gate stack 156 may include a gate dielectric layer 150, a work function layer 152, and a conductive filling 154. In some embodiments, the formation of the metal gate stack 156 involves the deposition of multiple metal gate stack layers over the dielectric layer 140 to fill the trench 142 and the recesses 144. The metal gate stack layers extend into the recesses 144 and are wrapped around each of the semiconductor nanostructures 104'.

As illustrated in the embodiments shown in FIGS. 2G-1, 2G-3, 2H-1 and 2H-3, the spacer elements 126' and the protective layer 202 are trimmed to form the modified spacer elements 126" and the protective elements 202'. Therefore, the trench 142 becomes wider. Therefore, the filling the metal gate stack layers becomes easier. The quality and reliability of the metal gate stack 156 are improved.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, interfacial layers are formed on the surfaces of the semiconductor nanostructures 104'. The interfacial layers are very thin and are made of silicon oxide or germanium oxide, for example.

In some embodiments, the work function layer 152 is a single layer. In some other embodiments, the work function layer 152 includes multiple sub-layers. In some embodiments, some of the sub-layers are made of different materials. In some embodiments, some of the sub-layers are made of the same material.

The work function layer 152 may be used to provide the desired work function for transistors to enhance device performance including improved threshold voltage. In some embodiments, the work function layer 152 is used for forming a PMOS device. The work function layer is a p-type work function layer. The p-type work function layer is capable of providing a work function value that is suitable for the device, which may be equal to or greater than about 4.8 eV.

The p-type work function layer may include metal, metal carbide, metal nitride, one or more other suitable materials, or a combination thereof. For example, the p-type metal includes tantalum nitride, tungsten nitride, titanium, titanium nitride, one or more other suitable materials, or a combination thereof.

In some embodiments, the work function layer 152 is used for forming an NMOS device. The work function layer is an n-type work function layer. The n-type work function layer is capable of providing a work function value that is suitable for the device, which may be equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

The work function layer 152 may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer 152 and/or the thickness and/or the compositions of the sub-layers of the work function layer 152 may be fine-tuned to adjust the work function level.

The work function layer 152 may be deposited over the gate dielectric layer 150 using an ALD process, a CVD process, a PVD process, an electroplating process, an electroless plating process, one or more other applicable processes, or a combination thereof. In some embodiments, the formation of the work function layer 152 involves one or more patterning processes. As a result, the p-type work function layer and the n-type work function layer are selectively formed over respective regions.

In some embodiments, a barrier layer is formed before the work function layer 152 to interface the gate dielectric layer 150 with the subsequently formed work function layer. The barrier layer may also be used to prevent diffusion between the gate dielectric layer 150 and the subsequently formed work function layer 152. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive filling 154 is made of or includes a metal material. The metal material may include tungsten, aluminum, copper, cobalt, one or more other suitable materials, or a combination thereof. A conductive layer used for forming the conductive filling 154 may be deposited over the work function layer 152 using a CVD process, an ALD process, a PVD process, an electroplating process, an electrochemical plating process, a spin coating process, another applicable process, or a combination thereof.

In some embodiments, a blocking layer is formed over the work function layer 152 before the formation of the conductive layer used for forming the conductive filling 154. The blocking layer may be used to prevent the subsequently formed conductive layer from diffusing or penetrating into the work function layer 152. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trench 142, in accordance with some embodiments. As a result, the remaining portions of the metal gate stack layers form the metal gate stack 156, as shown in FIGS. 2J-1, 2J-2, and 2J-3.

In some embodiments, the conductive filling 154 does not extend into the recesses 144 since the recesses 144 are small and have been filled with other elements such as the gate dielectric layer 150 and the work function layer 152. However, embodiments of the disclosure are not limited thereto. In some other embodiments, a portion of the conductive filling 154 extends into the recesses 144.

As shown in FIG. 2J-3, the metal gate stack 156 is separated from the epitaxial structures 138 by the protective elements 202' and the inner spacers 136. With the protective elements 202', the metal gate stack 156 is prevented from extending towards the epitaxial structures 138 along the edges of the modified spacer elements 126". The risk of short circuiting between the metal gate stack 156 and the epitaxial structures 138 is significantly reduced. The performance and reliability of the semiconductor device structure are greatly improved.

In some embodiments illustrated in FIGS. 2J-1 and 2J-3, the protective elements 202' have protruding portions P with curved surfaces. However, embodiments of the disclosure are not limited thereto. Many variations and/or modifications can be made to embodiments of the disclosure. In some other embodiments, the protective elements 202' have no protruding portion.

Figures 1, 3A:
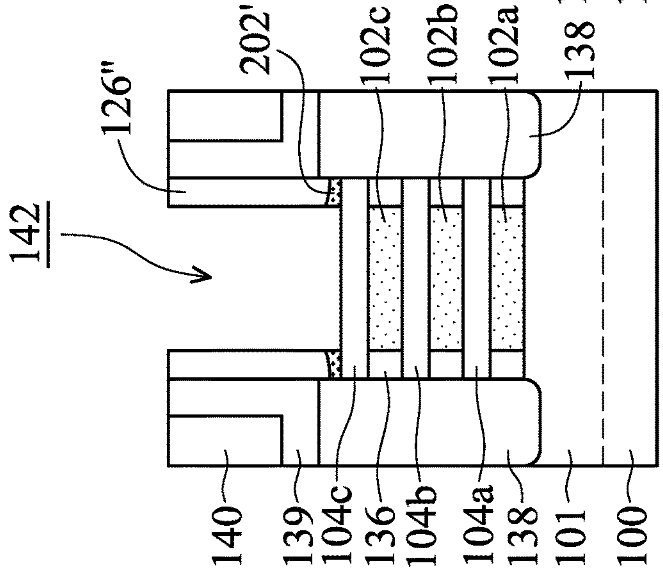
Figures 2, 3A:
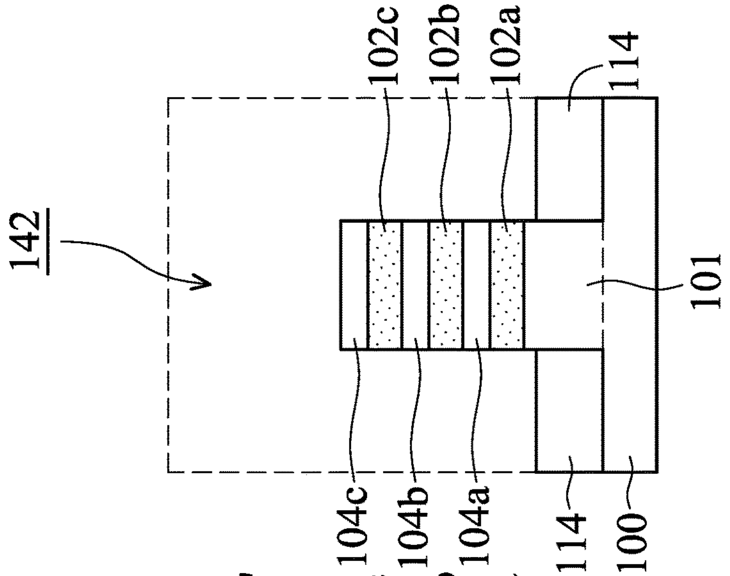
Figures 3, 3A:
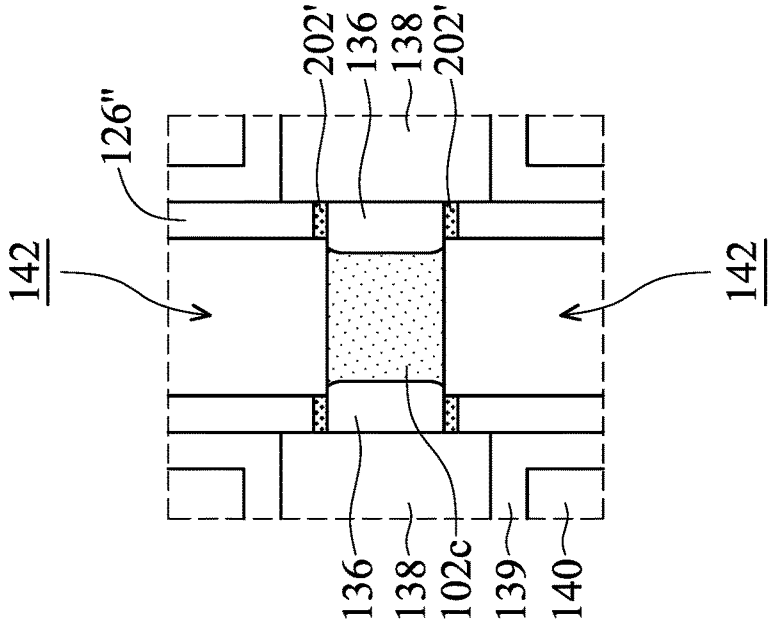
Figures 1, 3B:
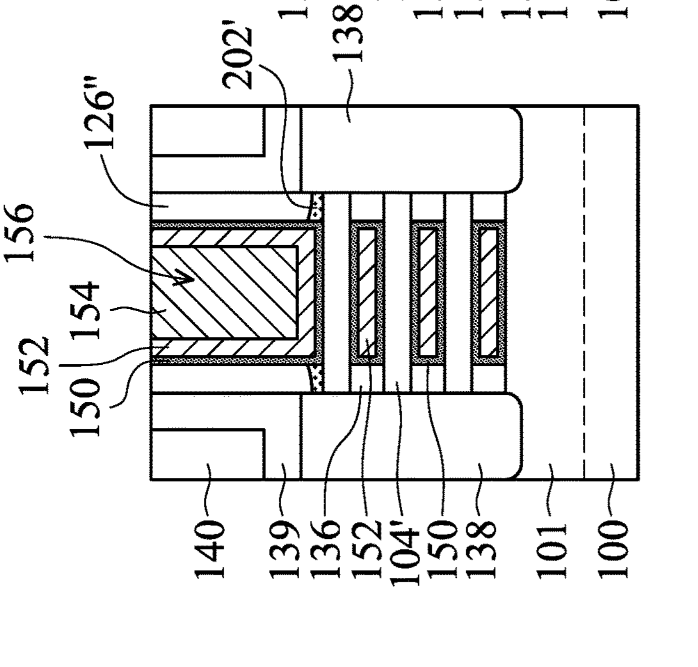
Figures 2, 3B:
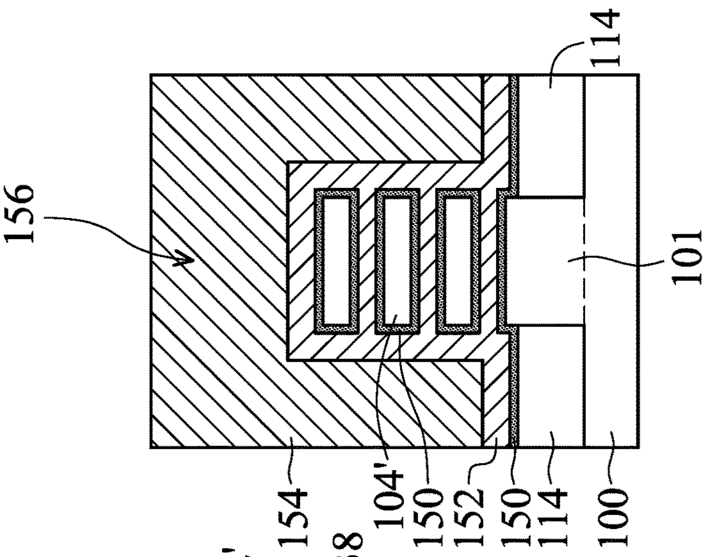
Figures 3, 3B:
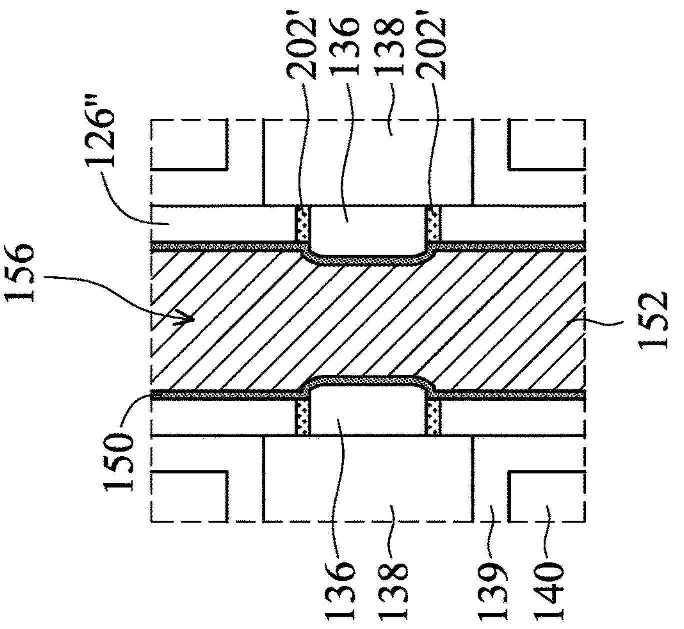

FIGS. 3A-1 to 3B-1 are cross-sectional views of various stages of a process for forming a portion of a semiconductor device structure, in accordance with some embodiments. FIGS. 3A-2 to 3B-2 are cross-sectional views of various stages of a process for forming a portion of a semiconductor device structure, in accordance with some embodiments. FIGS. 3A-3 to 3B-3 are cross-sectional views of various stages of a process for forming a portion of a semiconductor device structure, in accordance with some embodiments.

Similar to the embodiments illustrated in FIGS. 2G-2H, the structure shown in FIGS. 3A-1, 3A-2, and 3A-3 is formed, in accordance with some embodiments. In some embodiments, the materials of the protective elements 202' and the modified spacer elements 126" are substantially the same. Therefore, the profiles of the protective elements 202' and the modified spacer elements 126" may be similar after the etching process. In some embodiments, the interior sidewalls of the protective elements 202' and the modified spacer elements 126" are substantially vertically aligned with each other, as shown in FIGS. 3A-1 and 3A-3.

Alternatively, in some other embodiments, the protective elements 202' and the modified spacer elements 126" are made of different materials. By fine-tuning the conditions of the etching process, the protective elements 202' with the profiles illustrated in FIGS. 3A-1 and 3A-3 are formed.

Afterwards, the processes that are similar to the embodiments illustrated in FIGS. 2I-2J are performed. As a result, the structure shown in FIGS. 3B-1, 3B-2, and 3B-3 is formed, in accordance with some embodiments.

In the embodiments illustrated in FIGS. 2 and 3, there are three semiconductor nanostructures stacked vertically. However, embodiments of the disclosure are not limited thereto. The number of the vertically stacked semiconductor nanostructures may be varied. The number of the vertically stacked semiconductor nanostructures may be within a range from about 2 to about 10. In some embodiments, the number of the vertically stacked semiconductor nanostructures may be varied at different regions. In some embodiments, there are two or three vertically stacked semiconductor nanostructures at a first region, and there are three or four vertically stacked semiconductor nanostructures at a second region.

Some embodiments of the disclosure relate to the GAA devices with semiconductor nanosheets. However, embodiments of the disclosure are not limited thereto. Many variations and/or modifications can be made to embodiments of the disclosure. Some other embodiments may relate to planar transistor devices, FinFET devices, GAA devices including forksheets, one or more other applicable devices, or a combination thereof.

In accordance with some embodiments, a protective layer is formed to replace dummy gate dielectric layer of a dummy gate stack. The protective layer may protect the channel layer thereunder during the formation of the dummy gate stack. The quality and reliability of the channel structures are improved. A metal gate stack may be formed to replace the dummy gate stack. Due to the protective layer, the metal gate stack may have a desired profile. The metal gate stack is prevented from extending towards the epitaxial structures. The risk of short circuiting between the metal gate stack and the epitaxial structures is significantly reduced. The performance and reliability of the semiconductor device structure are greatly improved.

In accordance with some embodiments, a method for forming a semiconductor device structure is provided. The method includes forming a fin structure over a substrate and forming a nitrogen-containing protective layer over a top and sidewalls of the fin structure. The method also includes forming a dummy gate electrode over the nitrogen-containing protective layer and forming a spacer element over a sidewall of the dummy gate electrode. The method further includes forming a dielectric layer surrounding the dummy gate electrode and removing the dummy gate electrode to form a trench exposing the nitrogen-containing protective layer. In addition, the method includes partially removing the nitrogen-containing protective layer to expose the fin structure and forming a metal gate stack wrapped around the fin structure.

In accordance with some embodiments, a method for forming a semiconductor device structure is provided. The method includes forming a fin structure over a substrate and forming a protective layer over a top and sidewalls of the fin structure. The method also includes forming a dummy gate electrode over the protective layer. The fin structure is covered by the protective layer and is prevented from being etched during the formation of the dummy gate electrode. The method further includes forming a spacer element over a sidewall of the dummy gate electrode and removing the dummy gate electrode to form a trench exposing the protective layer and an interior sidewall of the spacer element. In addition, the method includes partially removing the protective layer to expose the fin structure and forming a metal gate stack wrapped around the fin structure.

In accordance with some embodiments, a semiconductor device structure is provided. The semiconductor device structure includes multiple semiconductor nanostructures over a substrate and a metal gate stack wrapped around each of the semiconductor nanostructures. The semiconductor device structure also includes a spacer element extending along a sidewall of the metal gate stack. The semiconductor device structure further includes a nitrogen-containing protective element below the spacer element. The metal gate stack is in direct contact with the nitrogen-containing protective element and the spacer element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming a fin structure over a substrate;

forming a nitrogen-containing protective layer continuously extending along a top and sidewalls of the fin structure;

forming a dummy gate electrode over the nitrogen-containing protective layer;

forming a spacer element over a sidewall of the dummy gate electrode;

forming a dielectric layer surrounding the dummy gate electrode;

removing the dummy gate electrode to form a trench exposing the nitrogen-containing protective layer;

partially removing the nitrogen-containing protective layer to expose the fin structure; and forming a metal gate stack wrapped around the fin structure.

2. The method for forming a semiconductor device structure as claimed in claim 1, further comprising:

partially removing the spacer element so that the trench becomes wider.

3. The method for forming a semiconductor device structure as claimed in claim 2, wherein the partial removal of the spacer element and the partial removal of the nitrogen-containing protective layer are performed simultaneously.

4. The method for forming a semiconductor device structure as claimed in claim 3, wherein the partial removal of the spacer element and the partial removal of the nitrogen-containing protective layer are performed using an etching process, and the etching process comprises a plurality of dry etching operations and a plurality of wet etching operations.

5. The method for forming a semiconductor device structure as claimed in claim 1, wherein the fin structure comprises a plurality of sacrificial layers and a plurality of semiconductor layers laid out alternately.

6. The method for forming a semiconductor device structure as claimed in claim 1, wherein the spacer element has a higher atomic concentration of carbon than that of the nitrogen-containing protective layer.

7. The method for forming a semiconductor device structure as claimed in claim 1, wherein the spacer element has an atomic concentration of nitrogen that is equal to or lower than that of the nitrogen-containing protective layer.

8. The method for forming a semiconductor device structure as claimed in claim 1, wherein the fin structure is covered by the nitrogen-containing protective layer during the formation of the dummy gate electrode.

9. The method for forming a semiconductor device structure as claimed in claim 1, wherein the metal gate stack is formed to be in direct contact with the nitrogen-containing protective layer and the spacer element.

10. The method for forming a semiconductor device structure as claimed in claim 1, wherein an entirety of the dummy gate electrode is formed after the nitrogen-containing protective layer.

11. A method for forming a semiconductor device structure, comprising:

forming a fin structure over a substrate;

forming a protective layer over a top and sidewalls of the fin structure;

forming a dummy gate electrode over the protective layer after the protective layer is formed over the top and sidewalls of the fin structure, wherein the fin structure is covered by the protective layer and is prevented from being etched during the formation of the dummy gate electrode;

forming a spacer element over a sidewall of the dummy gate electrode;

removing the dummy gate electrode to form a trench exposing the protective layer and an interior sidewall of the spacer element;

partially removing the protective layer to expose the fin structure; and forming a metal gate stack wrapped around the fin structure.

12. The method for forming a semiconductor device structure as claimed in claim 11, further comprising:

partially removing the spacer element from the interior sidewall of the spacer element while the protective layer is partially removed.

13. The method for forming a semiconductor device structure as claimed in claim 11, wherein the protective layer comprises nitrogen, carbon, or a combination thereof.

14. The method for forming a semiconductor device structure as claimed in claim 11, wherein the fin structure comprises a plurality of sacrificial layers and a plurality of semiconductor layers laid out alternately, and the method further comprises:

removing the sacrificial layers after the partial removal of the protective layer and before the formation of the metal gate stack, wherein remaining portions of the semiconductor layers form a plurality of semiconductor nanostructures, and the metal gate stack is wrapped around each of the semiconductor nanostructures after the formation of the metal gate stack.

15. The method for forming a semiconductor device structure as claimed in claim 11, wherein the protective layer is partially removed to have a curved surface while the dummy gate electrode is formed, and the spacer element covers the curved surface.

16. A method for forming a semiconductor device structure, comprising:

forming a semiconductor protruding structure;

forming a protective layer over the semiconductor protruding structure, wherein the protective layer contains nitrogen, and the protective layer continuously covers opposite sidewalls of the semiconductor protruding structure;

forming a dummy gate electrode over the protective layer;

forming a spacer element over a sidewall of the dummy gate electrode, wherein the spacer element has an atomic concentration of nitrogen that is equal to or lower than that of the protective layer;

removing the dummy gate electrode;

partially removing the protective layer to partially expose the semiconductor protruding structure; and forming a metal gate stack over the semiconductor protruding structure.

17. The method for forming a semiconductor device structure as claimed in claim 16, wherein the spacer element has a higher atomic concentration of carbon than that of the protective layer.

18. The method for forming a semiconductor device structure as claimed in claim 16, wherein the protective layer is formed to have a portion gradually becomes thicker along a direction toward the metal gate stack.

19. The method for forming a semiconductor device structure as claimed in claim 16, further comprising:

forming an epitaxial structure beside the semiconductor protruding structure, wherein a first interface between the epitaxial structure and the semiconductor protruding structure connects a second interface between the epitaxial structure and the protective layer.

20. The method for forming a semiconductor device structure as claimed in claim 16, wherein the protective layer is formed to have a curved top surface.

* * * * *